United States Patent [19]
Kashiro

[11] Patent Number: 6,037,017
[45] Date of Patent: *Mar. 14, 2000

[54] METHOD FOR FORMATION OF MULTILAYER FILM

[75] Inventor: Takeshi Kashiro, Kawasaki, Japan

[73] Assignee: Kabushiki Kaisha Toshiba, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/428,859

[22] Filed: Apr. 25, 1995

[30] Foreign Application Priority Data

Apr. 26, 1994 [JP] Japan .................................. 6-087068

[51] Int. Cl.$^7$ .................. C23C 16/50; H01L 21/336; H01L 21/443
[52] U.S. Cl. .................. 427/579; 427/578; 438/585
[58] Field of Search .................. 205/186; 427/569, 427/575, 578, 579; 438/585

[56] References Cited

U.S. PATENT DOCUMENTS

| | | | |
|---|---|---|---|
| 4,892,753 | 1/1990 | Wang et al. | 427/38 |
| 5,017,403 | 5/1991 | Pang et al. | 427/39 |
| 5,037,666 | 8/1991 | Mori | 427/38 |
| 5,102,496 | 4/1992 | Savas | 156/643 |
| 5,380,566 | 1/1995 | Robertson et al. | 427/534 |
| 5,420,044 | 5/1995 | Kozuka | 437/4 |

FOREIGN PATENT DOCUMENTS

| | | | |
|---|---|---|---|
| 59-14549 | 4/1984 | Japan . | |
| 63-79970 | 4/1988 | Japan . | |
| 6-158331 | 6/1994 | Japan | 427/569 |

OTHER PUBLICATIONS

R. W. Berry et al. Thin Film Technology. Van Nostrand Reinhold Company, New York, pp. 191–209, 1968, month of application not available.

L. I. Maissel, Handbook of Thin Film Technology, McGraw–Hill Book Co., New York, pp. 4–1 to 4–13, 1970, month of application not available.

J.L. Vossen et al. Thin Film Technology. Academic Press, New York, pp. 24–33, and 499–501, 1978, month of application not available.

*Primary Examiner*—Kathryn Gorgos
*Assistant Examiner*—William T. Leader
*Attorney, Agent, or Firm*—Finnegan, Henderson, Farabow, Garrett & Dunner, L.L.P.

[57] ABSTRACT

A method for forming a multilayer film by introducing a material gas into a reduced-pressure reaction chamber provided with a pair of parallel planer electrodes and supplying a high-frequency electric power to the electrodes thereby generating a plasma state therein and depositing a film on a substrate disposed on one of the electrodes, comprising the steps of (a) introducing a first material gas into the reaction chamber and supplying the high-frequency electric power to the electrodes thereby generating the plasma state and depositing a first film on the substrate, (b) introducing stepwise a preparatory gas and adjusting stepwise a distance between the electrodes, a pressure inside the chamber and a RF power supplied to the electrodes while continuously retaining the plasma state subsequently to step (a), and (c) introducing a second material gas into the reaction chamber while continuously retaining the plasma state thereby and depositing a second film on the first film. According to the method the surface between the films is desirably formed, and this cause a promotion of characteristics when applied to produce a multilayer films constitutes semiconductor device, a TFT and a solar cell for example.

15 Claims, 10 Drawing Sheets

| STEP | | 1 | 2 | 3 | 4 | 5 | 6 | 7 | 8 |
|---|---|---|---|---|---|---|---|---|---|
| GAS SPECIES (VOLUME : sccm) | SiH$_4$ | (200) | | | (500) | | | | (350) |
| | NH$_3$ | (1000) | | | | | (2800) | (2800) | (2800) |
| | N$_2$ | (7000) | | | | | | (3500) | (3500) |
| | H$_2$ | | (2800) | (2800) | (2800) | (2800) | (500) | | |
| PRESSURE (Torr) | | 1.2 | VALVE OPEN | 1.2 | 3 | VALVE OPEN | 3.5 | 3.5 | 3.5 |
| DISTANCE (mm) | | 19.1 | 35.6 | 14.0 | 14.0 | 30.5 | 17.0 | 17.0 | 17.0 |
| RF POWER (W) | | 1300 | 100 | 100 | 150 | 150 | 150 | 150 | 1700 |
| DURATION (Sec) | | 19 | 10 | 5 | 49 | 5 | 3 | 5 | 53 |

FIG. 9

| STEP | | 1 | 2 | 3 | 4 | 5 | 6 | 7 | 8 |
|---|---|---|---|---|---|---|---|---|---|
| GAS SPECIES (VOLUME; sccm) | SiH₄ | (200) | | | | | | | |
| | NH₃ | (1000) | | | (500) | | | | (350) |
| | N₂ | (7000) | | | | | (2800) | (2800) | (2800) |
| | H₂ | | (2800) | (2800) | (2800) | (2800) | (500) | (3500) | (3500) |
| PRESSURE (Torr) | | 1.2 | VALVE OPEN | 1.2 | 3 | VALVE OPEN | 3.5 | 3.5 | 3.5 |
| DISTANCE (mm) | | 19.1 | 35.6 | 14.0 | 14.0 | 30.5 | 17.0 | 17.0 | 17.0 |
| RF POWER (W) | | 1300 | 100 | 100 | 150 | 150 | 150 | 150 | 1700 |
| DURATION (Sec) | | 19 | 10 | 5 | 49 | 5 | 3 | 5 | 53 |

FIG. 13

| STEP | | 1 | 2 | 3 | 4 | 5 | 6 | 7 |
|---|---|---|---|---|---|---|---|---|
| GAS SPECIES (VOLUME: sccm) | $SiH_4$ | (30) | | | | | | (20) |
| | $H_2$ | (600) | (600) | | (10) | | | |
| | $NH_3$ | | | (50) | (50) | | | |
| | $N_2$ | | | (350) | (350) | (350) | (400) | (400) |
| | $N_2O$ | | | | | | (120) | (120) |
| PRESSURE (Torr) | | 4 | VALVE OPEN | 0.5 | 0.8 | VALVE OPEN | 0.8 | 1.2 |
| DISTANCE (mm) | | 13.6 | 35.6 | 15.2 | 15.2 | 35.6 | 14.0 | 14.0 |
| RF POWER (W) | | 50 | 30 | 50 | 200 | 100 | 100 | 200 |
| DURATION (Sec) | | 73 | 10 | 5 | 7 | 10 | 5 | 7 |

METHOD FOR FORMATION OF MULTILAYER FILM

BACKGROUND OF THE INVENTION

1. Field of the Invention

This invention relates to a method for the formation of a multilayer film and more particularly to a method for the formation of a multilayer film constituting itself such a semiconductor device as a thin-film transistor.

2. Description of the Related Art

Methods for forming a multilayer film on a substrate by plasma discharge have been known for long. One of the methods utilizes parallel planar electrodes to generate plasma. This method consists in forming a deposited film on a substrate or on a film already formed on a substrate by introducing a material gas into a reduced-pressure reaction chamber provided with parallel planar electrodes and supplying a high-frequency electric power between the electrodes thereby generating a plasma therein. To generate the plasma state, a microwave discharge and a electron cyclotron resonance have been known other than high frequency discharge. A multilayer film is formed by repeating this procedure.

The manufacture of thin-film transistors, solar cells, etc. by the application of the method for the formation of a multilayer film to processes for the production of semiconductor devices has been realized. Particularly, thin-film transistors (TFT) have been attracting keen attention on account of their adaptability for liquid crystal display devices and contact sensors. As respects the TFT's for use in the liquid crystal display devices, amorphous silicon (a-Si) type semiconductors are mainly used because they allow their active layers to enjoy a large increase in surface area and they can be formed at a relatively low temperature. For the a-Si type TFT's, the inverted staggered (bottom gate) construction or the normal staggered (top gate) construction in which a gate electrode is disposed on one side and a source electrode and a drain electrode are disposed on the other side of a semiconductor film formed of an a-Si film to serve as an active layer are adopted often.

For the multilayer films which function as semiconductor devices, the qualities of the interfaces between the component films of the multilayer film are extremely important. The interface between a gate insulating film and a semiconductor film in a TFT, for example, constitutes itself a channel for the TFT and plays an extremely important role in improving the switching characteristics of the TFT. The interface between the semiconductor film and a etching-stopper film on channel constitutes itself a rear channel for the TFT and plays a very important role in improving the switching characteristics of TFT similarly to the interface between the gate insulating film and the semiconductor film.

Heretofore, in the production of a inverted staggered type TFT, for example, a gas for the formation of a gate insulating film is introduced into a reduced-pressure reaction chamber provided with parallel planar electrodes and a high-frequency electric power is supplied between the electrodes so as to generate a plasma state and deposit a gate insulating film on a glass insulating substrate having a gate electrode formed in advance thereon. Subsequently, the plasma state is stopped, the reaction chamber is evacuated, and a gas for the formation of a semiconductor is introduced into the empty reaction chamber to generate a plasma state and deposit a semiconductor film. For the purpose of further forming a etching-stopper-film on channel on the semiconductor film, the plasma state is stopped after the deposition of the semiconductor layer, the reaction chamber is evacuated, and a gas for the deposition of an etching-stopper-film on the channel is introduced into the empty reaction chamber to generate a plasma state and deposit the etching-stopper-film on channel.

In the production of the TFT of the normal staggered construction, the order in which the gate insulating film and the semiconductor film are superposed is reversed.

When the formation of a multilayer film is effected by a method which comprises depositing a first film, then stopping a plasma state, and again generating a plasma state to deposit a second film, the plasma state in the initial stage of the deposition of the second film is unstable, a defective density (dangling bond) is formed near the interface between the first and the second deposited film, and the multilayer film is not formed in a desirable form because the films are blistered or separated.

When the production of a TFT is effected by a method which comprises depositing a gate insulating film or a semiconductor film as the first deposited film, then stopping a plasma state, and again generating a plasma state to deposit a semiconductor film or a gate insulating film as the second deposited film, the plasma state in the initial stage of the deposition of the second film is unstable and a defective density (dangling bond) is formed near the interface between the semiconductor layer and the gate insulating film. This method, therefore, is at a disadvantage in forming no satisfactory interface and conferring no ideal characteristics on the produced TFT. It further has the problem that the interface between the first and the second deposited film is blistered and separated to the extent of lowering the yield of production. The fact that the plasma state to be formed again after the stop of the first plasma state takes no small time before it is stabilized impairs the productivity of this method.

The same remarks hold good for the operation of forming a semiconductor film as the first deposited film and a etching-stopper-film on channel as the second deposited film.

Incidentally, a method causes a state of plasma to last between a step of cleaning and a step of film forming in the plasma CVD process for forming a metallic or a ceramic coating on the surface of a tool, a metal die, or a machine part is disclosed under the title of "method for formation of highly adhesive thin film by plasma CVD technique" in JP-A-63-79,970. This particular invention attains the retention of the state of plasma by means of an electrode adapted exclusively therefor in addition to a discharge electrode to be used for the formation of the coating.

This invention is incapable of optimizing the state of plasma because of purpose of this invention is not focused on formation of multilayer film, and it adjusts neither the distance between the electrodes nor the internal pressure of the reaction chamber during the retention of the plasma state between the steps of depositing films. It, therefore, produces a multilayer film containing ideally formed interfaces only with difficulty.

SUMMARY OF THE INVENTION

As described above, the methods heretofore adopted for the formation of a multilayer film are at a disadvantage in failing to form highly satisfactory interfaces between the component films of multilayer films because the plasma state is stopped or because the plasma state, if not stopped, cannot be optimized during the step of film forming. The fact that no satisfactory interfaces are formed entails the problem that the interfaces are blistered or separated to the extent of degrading the yield of production. When the multilayer film constitutes itself such a semiconductor device as a TFT, the inferior interfaces go to impair the characteristics of the device.

When the plasma state is once stopped, regeneration of the plasma state thereafter takes no small time before it is stabilized. The time thus spent goes to degrade the efficiency of the production.

The present invention has been produced for the purpose of solving such problems of the related art as are mentioned above. An object of this invention is to provide for the formation of a multilayer film a method which enables the interfaces of the component layers of the film to be formed highly satisfactorily.

Another object of this invention is to provide for the formation of a multilayer film which constitutes a semiconductor device, particularly a TFT, a method which allows a thin-film transistor of excellent characteristics by forming a highly satisfactory interface between a gate insulating layer and a semiconductor layer or between a semiconductor layer and a etching-stopper-film on channel.

Yet another object of this invention is to provide a method for forming a multilayer film with a highly satisfactory yield.

Still another object of this invention is to shorten the time spent in the component steps of process and improve the efficiency of the production.

The basic aspect of this invention resides in a method for forming a multilayer film by introducing a material gas into a reduced-pressure chamber and generating a plasma state therein by activating an electromagnetic field and depositing a film on a substrate disposed outside of the plasma state in the chamber, which method comprises the steps of (a) introducing a first material gas into the chamber and generating a plasma state therein by activating the electromagnetic field and depositing a first film on the substrate, (b) adjusting the electromagnetic field while continuously retaining the plasma state subsequently to step (a), and (c) introducing a second material gas into the chamber while continuously retaining the plasma state thereby generating the plasma state and depositing a second film on the first film.

The plasma state can be generated by a microwave discharge, a electron cyclotron resonance and a high frequency discharge. The remarks of the way of generating the plasma state hold good invariably hereinafter.

The aspect of this invention resides in a method for forming a multilayer film by introducing a material gas into a reduced-pressure reaction chamber provided with a pair of parallel planar electrodes and supplying a high-frequency electric power between the electrodes thereby generating plasma state therein and depositing a film on a substrate disposed on one of the electrodes or on a substrate having a predetermined film already formed thereon, which method comprises (a) a step of introducing a first material gas into the reaction chamber and supplying the high-frequency electric power between the electrodes thereby forming the state of plasma and producing a first film on the substrate disposed on one of the electrodes or on the substrate having a predetermined film already formed thereon and (b) a step of introducing a second material gas into the reaction chamber while retaining the state of plasma without interruption thereby producing the state of plasma and forming a second film on the first deposited film.

As a result, the state of plasma is retained without interruption at least from the start of the formation of the first deposited film through the completion of the formation of the second deposited film.

The method for the formation of a multilayer film according to this invention naturally can be applied to the continuous formation of an additional deposited film on the second deposited film which has been formed as described above. To be specific, this addition of the deposited film is attained by using the second deposited film as the first deposited film and superposing thereon the new deposited film. It is naturally allowable to give a stated treatment such as, for example, an etching treatment to the multilayer film already formed and superpose a deposited film on the treated multilayer film.

The method for the formation of a multilayer film according to this invention, therefore, may be combined with a predetermined treatment for the purpose of manufacturing such devices as a TFT, a liquid crystal display device, and a solar cell, etc.

The same remarks hold good for the following aspects of this invention unless otherwise specified.

Other aspect of this invention resides in a method for forming a multilayer film by introducing a material gas into a reduced-pressure reaction chamber provided with at least one pair of parallel planar electrodes and supplying a high-frequency electric power between the electrodes thereby generating plasma state therein and depositing a film on a substrate disposed on one of the electrodes or on a substrate having a predetermined film already formed thereon, which method comprises (a) a step of introducing a first material gas into the reaction chamber and supplying the high-frequency electric power between the electrodes thereby generating the plasma state and depositing a first film on the substrate disposed on one of the electrodes or on the substrate having a predetermined film already formed thereon, (b) a step of effecting stepwise adjustment of the distance between the electrodes while continuously retaining the plasma state without interruption subsequently to the step of (a), and (c) a step of introducing a second material gas into the reaction chamber continuously while retaining the plasma state without interruption thereby producing the plasma state and depositing a second film on the first film.

As a result, the plasma state is continuously generated without interruption at least from the start of the deposition of the first film through the completion of the deposition of the second film.

As regards the second material gas, it is desirable that the components thereof be introduced stepwise.

Yet, other aspect of this invention resides in a method for forming a multilayer film by introducing a material gas into a reduced-pressure reaction chamber provided with at least one pair of parallel planar electrodes and supplying a high-frequency electric power between the electrodes thereby generating plasma state therein and depositing a film on a substrate disposed on one of the electrodes or on a substrate having a predetermined film already formed thereon, which method comprises (a) a step of introducing a first material gas into the reaction chamber and supplying the high-frequency electric power between the electrodes thereby generating the plasma state and depositing a first film on the substrate disposed on one of the electrodes or on the substrate having a predetermined film already formed thereon, (b) a step of making stepwise introduction into the reaction chamber of a preparatory gas constituting itself one of the components of the second material gas and not forming substantially in itself a second film while continuously retaining the state of plasma without interruption subsequently to the step of (a), (c) a step of effecting stepwise adjustment of the distance between the electrodes while continuously retaining the plasma state without interruption, and (d) a step of introducing a second material gas into the reaction chamber while continuously retaining the plasma state without interruption thereby generating the plasma state and depositing a second film on the first deposited film.

As a result, the plasma state is continuously retained without interruption at least from the start of the deposition of the first film through the completion of the deposition of the second film.

The adjustment of the distance between the electrodes in this invention is basically carried out by increasing the distance between the electrodes when the internal pressure of the reaction chamber falls and decreasing the distance when the internal pressure rises.

As the preparatory gas, at least one member selected from the group consisting of $H_2$, He, Ar, $N_2$, $NH_3$, $N_2O$, and Kr may be used.

The remarks of the preparatory gas hold good invariably hereinafter.

Further, other aspect of this invention resides in a method for forming a multilayer film by introducing a material gas into a reduced-pressure reaction chamber provided with at least one pair of parallel planar electrodes and supplying a high-frequency electric power between the electrodes thereby generating plasma state therein and depositing a film on a substrate disposed on one of the electrodes or on a substrate having a predetermined film already formed thereon, which method comprises (a) a step of introducing a first material gas into the reaction chamber and supplying the high-frequency electric power between the electrodes thereby forming the state of plasma and producing a first film on the substrate disposed on one of the electrodes or on the substrate having a predetermined film already formed thereon, (b) a step of making multistage introduction into the reaction chamber of a preparatory gas made of gas or dilute gas constituting itself one of the components of the second material gas and not forming substantially in itself a second film while retaining the state of plasma without interruption subsequently to the step of (a), (c) a step of effecting multistage adjustment of the pressure in the reaction chamber to the exhaust gas pressure or to a level equal to or lower than the pressure existing at the step of forming the second deposited film while retaining the state of plasma without interruption, (d) a step of effecting multistage adjustment of the distance between said electrodes while retaining the state of plasma without interruption, and (e) a step of introducing a second material gas into the reaction chamber while retaining the state of plasma without interruption thereby producing the state of plasma and forming a second film on the first deposited film.

There is a sequence between the steps of the film deposition the pressure which exists in the state in which the introduced gas is flowing into the reaction chamber and not to the state of vacuum. The multilayer film to be formed is allowed to acquire a highly desirable interface when the pressure existent during the formation of a deposited film is adjusted to a level equal to or lower than the pressure which exists during the step of film forming.

The distance between the electrodes is subjected to multistage adjustment in conformity with the internal pressure of the reaction chamber so as to ensure retention of the state of plasma without interruption.

As a result, the state of plasma is retained without interruption at least from the start of the formation of the first deposited film through the completion of the formation of the second deposited film.

As described above, this invention allows formation of a plurality of deposited films while continuously retaining the plasma state without interruption.

The term "plasma state" refers to the state in which a gas is decomposed into an ion and an electron, and is not dependent on the gas species generating the plasma. Therefore the plasma state is able to retain continuously though the gas species changed.

It also allows optimization of the plasma state between the step for the formation of a deposited film and the step for the film deposition.

By entirely the same procedure, a multilayer film for constituting a TFT can be formed.

To be specific, the multilayer film constituting itself a stated TFT can be produced by forming an insulating film, a semiconductor film, and a semiconductor protective film as deposited films.

In the method for the formation of a multilayer film which is composed of a gate insulating film, a semiconductor film, and an etching-stopper-film on the channel to constitute itself a thin-film transistor, the formation of the semiconductor film on the gate insulating film is attained by effecting stepwise adjustment of the distance between the discharge electrodes while retaining the plasma state subsequently to the formation of the gate insulating film and then forming the semiconductor film and the formation of the etching-stopper-film on channel on the semiconductor film is attained by effecting stepwise adjustment of the distance between the discharge electrodes while retaining the plasma subsequently to the formation of the semiconductor film and then forming the etching-stopper-film on channel.

This invention, as described above, concerns a method for forming a multilayer film while continuously retaining a state of plasma without interruption. The state of plasma between the steps for formation of a deposited film can be optimized by adjusting such conditions as the distance between the electrodes, the kinds of gas introduced, the internal pressure of the reaction chamber, and the magnitude of the high-frequency electric power supplied. Thus, a multilayer film of uniform quality can be formed from a stable plasma state. The multilayer film possesses a highly desirable interface because of freedom from blister or separation. The multilayer film is formed in a high yield. Since the state of plasma does not need to be reformed, the time spent for the formation of the multilayer film can be decreased and the efficiency of the production can be improved.

Thus, the TFT to be consequently produced is enabled to acquire outstanding characteristics mainly because the defective density (dangling bond) near the interface between the gate insulating film and the semiconductor film, the interface between the semiconductor film and the etching-stopper-film on channel, and the interface between the semiconductor film and the gate insulating film is decreased.

BRIEF DESCRIPTION OF THE DRAWINGS

FIG. 9 is a schematic diagram of the multilayer film processing in the example 5.

FIG. 13 is a schematic diagram of the multilayer film processing in the example 6.

DESCRIPTION OF THE PREFERRED EMBODIMENTS

EXAMPLE 1

The method of this invention for the formation of a multilayer film is applied to the manufacture of a inverted staggered (bottom-gate) TFT for use in an active matrix type liquid crystal display device.

Figure 1:
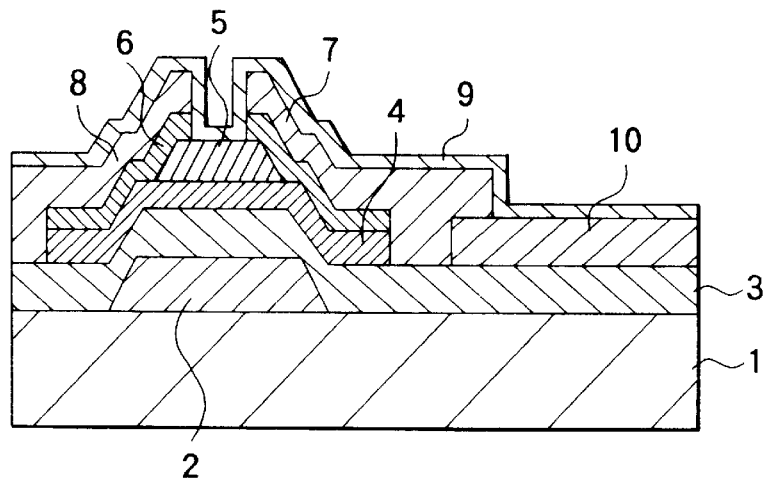
FIG. 1 is a sectional view showing a construction of a inverted staggered TFT in the example 1.

FIG. 1 shows a TFT in an active matrix type liquid crystal display device of Example 1.

This TFT is composed of a gate electrode 2 of a predetermined shape formed of molybdenum-tantalum integrally with a gate line (not shown) on a glass insulating substrate 1, a gate insulating film 3 of $SiN_x$ formed in a thickness of 0.3 μm in such a manner on the insulating substrate 1 as to cover the gate electrode 2, a semiconductor film 4 of a predetermined shape formed of a-Si film, microcrystalline silicon, or polycrystalline silicon in a thickness of 0.05 μm in such a manner as to cover the gate insulating film 3 in conformity with the gate electrode 2, a etching-stopper-film on channel 5 of a predetermined shape formed of $SiN_x$ film in a thickness of 0.3 μm so as to cover part of the semiconductor film 4, a n type semiconductor film 6 of $n^+$a-Si formed in a thickness of 0.05 μm in such a manner as to cover the etching-stopper-film on channel film 5 and a source region and a drain region on the semiconductor film, a source electrode 7 of chromium (cr) or aluminum (Al) superposed on the n type semiconductor film 6 as partly extended into the source region on the gate insulating film 3, a drain electrode 8 of Cr or Al formed likewise on the n type semiconductor film 6 as partly integrated with column lines (not shown) extended into the drain region on the gate insulating film 3, and an insulating protective film 9 of $SiN_x$ formed so as to cover the channel region on the source electrode 7, the drain electrode 8, and the n type semiconductor film 6. The source electrode 7 is connected to a pixel electrode 10 of ITO (indium tin oxide) formed on the gate insulating film 3.

Now, a typical method used for the manufacture of this TFT will be described below.

Figure 2A:
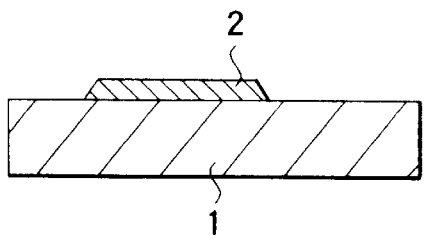
FIG. 2A is a sectional view showing the TFT of FIG. 1 according to a prossesing scheme.

The manufacture of this TFT is started with the formation of a metal film of Mo-Ta by the sputtering technique on the glass insulating substrate 1. By photolithographically etching this metal film, the gate electrode 2 of the predetermined shape is formed in conjunction with the gate line (FIG. 2A).

Figure 2B:
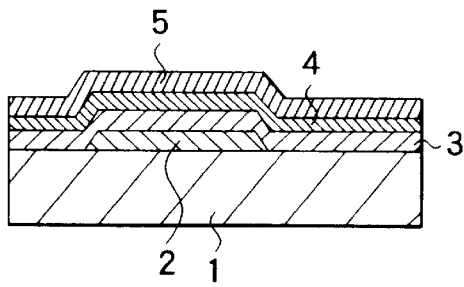
FIG. 2B is a sectional view showing the TFT of FIG. 1 according to a prossesing scheme.

The glass insulating substrate 1 having the gate electrode 2 formed thereon is set in place in a reaction chamber and heated to 623K. Then, a material gas for the deposition of the gate insulating film which is composed of silane ($SiR_4$), ammonia ($NH_3$), and nitrogen ($N_2$) is introduced into the reaction chamber and generated to a plasma state to form the gate insulating film 3 of $SiN_x$ having a thickness of 0.3 μm as shown in FIG. 2B.

Subsequently, with the plasma state existent during the deposition of the gate insulating film 3 retained continuously, the gas introduced into the reaction chamber is switched from the material gas for the deposition of the gate insulating film 3 to the hydrogen ($H_2$) or the helium (He) gas.

Next, the $SiH_4$ gas is introduced in conjunction with the $H_2$ or the He gas to form an a-Si film 4 as a semiconductor film in a thickness of 0.05 μm.

The introduction of the $SiH_4$ gas is subsequently stopped and, at the same time, the $H_2$ or the He gas is introduced with the plasma state continuously retained.

Then, the $NH_3$ gas is combined with the $H_2$ gas to continue the plasma state.

The introduction of the $H_2$ gas is stopped and the introduction of the $N_2$ gas is started to continue the plasma state.

The material gas for the deposition of the semiconductor protective film is produced by adding the $SiH_4$ gas to the $NH_3$ gas and the $N_2$ gas to produce a $SiN_x$ film 5 as the etching-stopper-film on channel 0.3 μm in thickness.

Figure 2C:
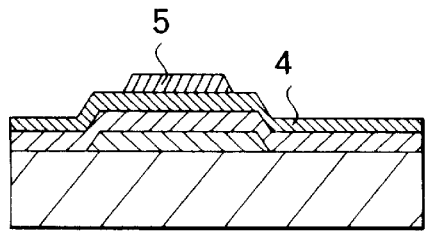
FIG. 2C is a sectional view showing the TFT of FIG. 1 according to a prossesing scheme.

By photolithography method, etching this $SiN_x$ film 5, the etching-stopper-film on channel 5 is formed in the predetermined shape as shown in FIG. 2C.

Figure 2D:
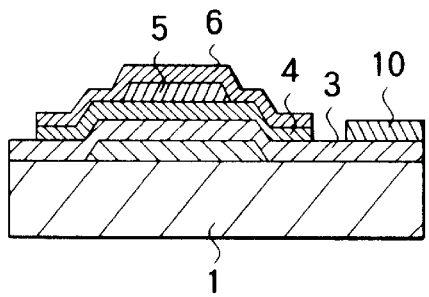
FIG. 2D is a sectional view showing the TFT of FIG. 1 according to a prossesing scheme.

Then, the glass insulating substrate 1 having the etching-stopper-film on channel 5 and other films formed thereon is heated and the gas formed of phosphine ($PH_3$) and $SiH_4$ for the formation of the n type semiconductor film is introduced to form a $n^+$ a-Si film in a thickness of 0.05 μm in such a manner as to cover the etching stopper film 5. Subsequently, by the photolithography method, this $n^+$ a-Si film is etched to form the n type semiconductor film 6 of the predetermined shape and the underlying a-Si film is etched to form the n type semiconductor film 4 of the predetermined shape as shown in FIG. 2D.

Thereafter, a transparent electrical conductive film of ITO is formed by the sputtering technique on the glass insulating substrate 1 having the n type semiconductor film 6 and other films formed thereon. This transparent electroconductive film is photolithographically etched to form the pixel electrode 10 of the predetermined shape at a stated position on the gate insulating film 3.

Figure 2E:
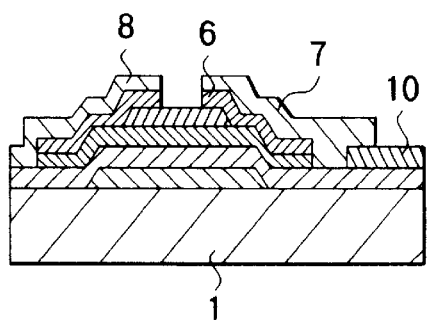
FIG. 2E is a sectional view showing the TFT of FIG. 1 according to a prossesing scheme.

Further, on the glass insulating substrate 1 having the pixel electrode 10 and other films formed thereon, the metal film of Cr or Al is formed by the sputtering technique. Then, by the photolithography technique, the source electrode 7 for connecting the n type semiconductor film 6 and the pixel electrode 10 and the drain electrode 8 connected to the n type semiconductor film 6 are formed integrally with the column lines. The part of the n type semiconductor film 6 in the channel region is removed by the photolithographic etching technique as masked by the source electrode 7 and the drain electrode 8 FIG. 2E.

Thereafter, the insulating protective film of $SiN_x$ is formed by the plasma CVD method on the glass insulating substrate 1 having the source electrode 7, the drain electrode 8, and other films deposited thereon to complete the TFT (FIG. 1).

The method for the formation of the multilayer film which is composed of the $SiN_x$ gate insulating film, the a-Si semiconductor film, and the $SiN_x$ etching-stopper film on channel to constitute the inverted staggered type TFT will be described more specifically hereinbelow.

Figure 3:
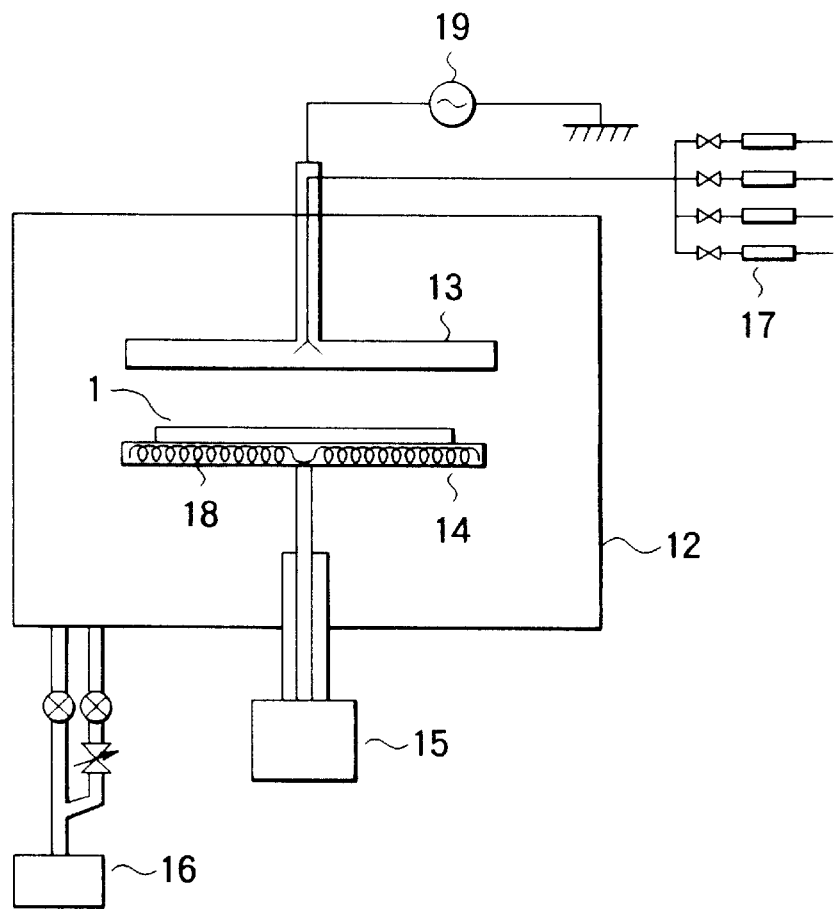
FIG. 3 is a sectional view showing the construction of the essential part of an apparatus to be used for the formation of the multilayer film.

FIG. 3 shows the construction of the essential part of a apparatus to be used for the formation of the multilayer film. This device is the so-called plasma CVD device with the parallel planar electrode. Inside a reaction chamber 12, a disklike high-frequency electrode 13 about 15 cm in diameter is set in place and a disklike grounding electrode 14 of about the same diameter is disposed thereunder as opposed to the high-frequency electrode 13. This grounding electrode 14 is adapted to be vertically moved so as to change freely the distance thereof from the high-frequency electrode 13 accurately within ±0.01 mm by means of an elevating unit 15 disposed outside the reaction chamber 12. The reaction chamber 12 is adapted to be evacuated by an evacuating unit 16. Further, the reaction chamber 12 is provided on the outside thereof with a gas inlet unit 17 for introducing a series of material gas and a series of preparatory gas into the reaction chamber 12 from the high-frequency electrode 13 side. The grounding electrode 14 is provided with a resistance heating unit 18 for heating a glass insulating substrate 1 seated on the grounding electrode 14 accurately within ±10° C. A high-frequency power source 19 is connected to the high-frequency electrode 13.

The plasma state is generated by a high frequency discharge in the apparatus shown in FIG. 3. It is also applicable to generate the plasma state by a microwave discharge or a electron cyclotron resonance (ECR) employing a known apparatus.

First, the glass insulating substrate 1 having the gate electrode formed thereon is fixed on the grounding electrode 14 of the reaction chamber 12 of the device mentioned above and the reaction chamber 12 is evacuated. The glass insulating substrate 1 is heated to 623K by the resistance heating unit 18 disposed on the grounding electrode 14 and, as the material gas for the deposition of the gate insulating film, $SiH_4$ gas fed at a flow volume of 10 sccm, $NH_3$ gas at 60 sccm, and $N_2$ gas at 400 sccm are introduced into the reaction chamber 12. A plasma state is generated between the high-frequency electrode 13 and the grounding electrode 14 to form the gate insulating film of $SiN_x$, with the internal pressure of the reaction chamber 12 adjusted at 0.8 Torr, the distance between the electrodes 13 and 14 at 30 mm, and the electric power supplied from the high-frequency power source 19 at 50 W.

At the same time that the introduction of the material gas for the deposition of the gate insulating film is stopped, the introduction of $H_x$ gas as the preparatory gas is started at a flow volume of 500 sccm. The plasma state existent during the formation of the gate insulating film mentioned above is retained without interruption with the internal pressure of the reaction chamber 12 adjusted at 0.3 Torr, the distance between the electrodes at 35 mm, and the electric power supplied from the high-frequency power source 19 at 35 W. This plasma state is desired to continue at least 3 seconds.

The influence of the material gas during the deposition of the gate insulating film can be eliminated by introducing the $H_2$ gas in a large amount and fixing the pressure of the gaseous atmosphere inside the reaction chamber 12 at 0.3 Torr as mentioned above. Further, the plasma state can be stably retained by setting the distance between the electrodes at such a large magnitude as 35 mm.

Then, the $H_2$ gas is introduced at a flow volume of 500 sccm. The plasma state is stably retained with the pressure inside the reaction chamber 12 fixed at 1.2 Torr, the distance between the electrodes at 28 mm, and the electric power supplied from the high-frequency power source 19 at 50 W.

Thereafter, the $H_2$ gas plus the $SiH_4$ gas are introduced as the material gas at a flow volume of 30 sccm. Thus, the semiconductor film of a-Si is deposited in a thickness of 0.05 $\mu$m, with the distance between the electrodes adjusted at 26 mm.

During the formation of the semiconductor film, the plasma state can be stably retained until the formation of the a-Si film by introducing $H_2$ as the preparatory gas and adjusting the internal pressure of the reaction chamber, the electric power to be supplied, and the distance between the electrodes. The dangling bond of the interface between the $SiN_x$ gate insulating film and the a-Si semiconductor film can be decreased by keeping the pressure prior to the formation of the a-Si film at a level lower than the pressure during the formation of the a-Si film.

Then, the introduction of the $SiH_4$ gas mentioned above is stopped and, at the same time, the introduction of $H_2$ gas as the preparatory gas is started at a flow volume of 500 sccm. The plasma state is retained without interruption by adjusting the internal pressure of the reaction chamber 12 at 0.3 Torr and, at the same time, adjusting the distance between the electrodes at 35 mm. This plasma state is desired to continue at least 5 seconds.

Subsequently, the hydrogen gas plus the $NH_3$ gas are introduced at a flow volume of 400 sccm. The plasma state is retained with the internal pressure of the reaction chamber 12 at 1.5 Torr, the distance between the electrodes at 24 mm, and the electric power supplied from the high-frequency power source 19 at 60 W. The state of plasma under the conditions mentioned above is desired to continue at least than 3 seconds.

Then, the introduction of the $H_2$ gas is stopped and, at the same time, the introduction of $N_2$ gas as the preparatorly gas is started at a flow volume of 500 sccm. The introduction of the $NH_3$ gas is still continued. The plasma state is stably retained by having the distance between the electrodes adjusted at 20 mm.

Subsequently, the $SiH_4$ gas is introduced at a flow volume of 50 sccm to form a material gas for deposition of an etching-stopper-film with the $N_2$ gas and $NH_3$ gas already introduced.

From the material gas with the plasma state continuously retained the SiNx etching-stopper-film on channel is deposited in a 0.3 $\mu$m thickness.

When the distance between the electrodes is adjusted in the stepwise pattern as described above, the plasma state can be stably retained without interruption in conformity with the kind of gas to be introduced and the pressure inside the reaction chamber. As a result, the TFT to be produced is enabled to acquire highly desirable properties because the dangling bond near the interface between the gate insulating film 3 and the semiconductor film 4 and the interface between the semiconductor film 4 and the etching-stopper film on channel 5.

In the conventional method for the formation of a multilayer film, the practice of stably retaining the plasma state by varying such conditions as the kind of gas to be introduced, the internal pressure of the reaction chamber, the high-frequency electric power to be supplied, and the distance between the electrodes as mentioned above is not followed. When the distance between the electrodes is adjusted in the stepwise pattern as in the case of the present example, however, the plasma state can be stably retained without interruption, for example, by decreasing the distance between the electrodes when the internal pressure of the reaction chamber is high and increasing the distance when the internal pressure is low in conformity to the kind of gas to be introduced, the internal pressure of the reaction chamber, and the high-frequency electric power to be supplied.

When a liquid crystal display substrate containing the TFT manufactured by the method of this invention for the formation of a multilayer film is incorporated by the standard process in an active matrix type liquid crystal display device and this device is operated, the TFT manifests an outstanding switching property.

The continuous plasma state functions as a means for continuing the plasma state from the gate insulating film 3 to the semiconductor film 4 and from the semiconductor film 4 to the etching-stopper-film 5. For the purpose of preventing the surface of the gate insulating film 3 and the surface of the semiconductor film 4 from being adversely affected by the chemical action of the plasma, the duration between the steps of film forming is desired to be in the range of from 3 to 20 seconds with a view to stabilizing the state of plasma and precluding the exertion of adverse effect on the surface.

The plasma state can be generated by a microwave discharge and a electron cyclotron resonance other than a high frequency discharge. The remarks of the way of generating the plasma state hold good invariably hereinafter.

As the preparatory gas, at least one member selected from the group consisting of $H_2$, He, Ar, $N_2$, $NH_3$, $N_2O$ and Kr can be used. The remarks of the preparatory gas hold good invariably hereinafter.

EXAMPLE 2

Figure 4:
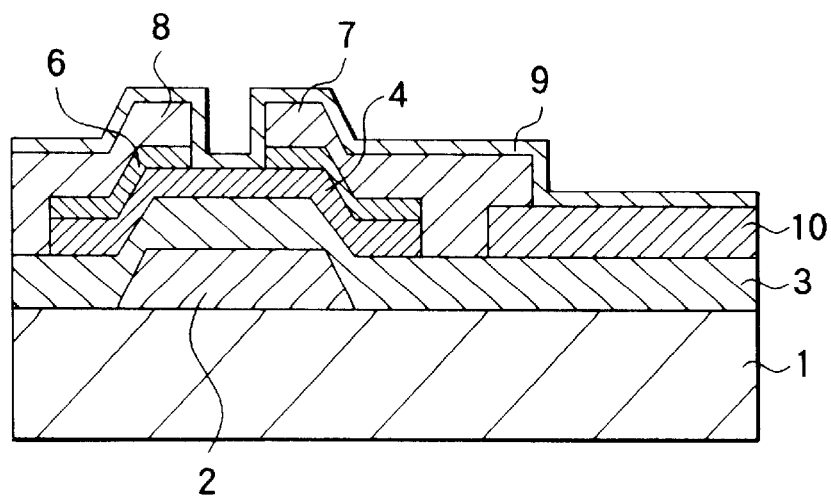
FIG. 4 is a sectional view showing a construction of a inverted staggered TFT in the example 2.

FIG. 4 shows a TFT in an active matrix type liquid crystal display device according to Example 2. This TFT is composed of a gate electrode 2 formed in a predetermined shape of Mo-Ta integrally with a gate line (not shown) on a glass insulating substrate 1, a gate insulating film 3 of $SiN_x$ formed in a thickness of 0.3 µm in such a manner on the insulating substrate 1 as to cover the gate electrode 2, a semiconductor film 4 formed in a predetermined shape of a-Si, microcrystalline silicon, or polycrystalline silicon in a thickness of 0.05 µm in such a manner as to cover the gate insulating film 3 in conformity to the gate electrode 2, an n type semiconductor film 6 formed of $n^+$ a-Si in such a manner as to cover the source region and the drain region other than the channel region on the semiconductor film 4, a source electrode 7 formed on the n type semiconductor film 6 as partly extended into the source region on the gate insulating film 3, a drain electrode 8 formed likewise on the n type semiconductor film 6 as partly integrated with a signal line (not shown) extended into the drain region on the gate insulating film 3, and an insulating protective film 9 formed of $SiN_x$ in such a manner as to cover the channel region on the source electrode 7, the drain electrode 8, and the n type semiconductor film 6. The source electrode 7 is connected to a pixel electrode 10 formed of ITO on the gate insulating film 3.

Figure 5A:
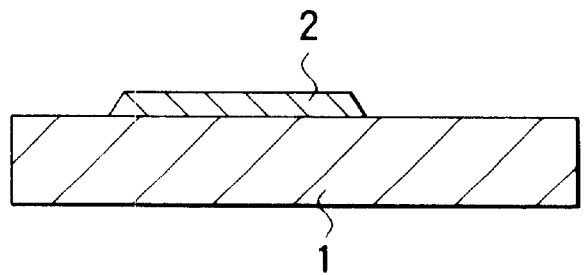
FIG. 5A is a sectional view showing the TFT of FIG. 4 according to a prossesing scheme.

The manufacture of the TFT is started with the formation of a metal film of Mo-Ta by the sputtering technique on the glass insulating substrate 1 as shown in FIG. 5A. This metal film is photolithographically etched to form the gate electrode 2 of the predetermined shape in conjunction with the gate line.

Figure 5B:
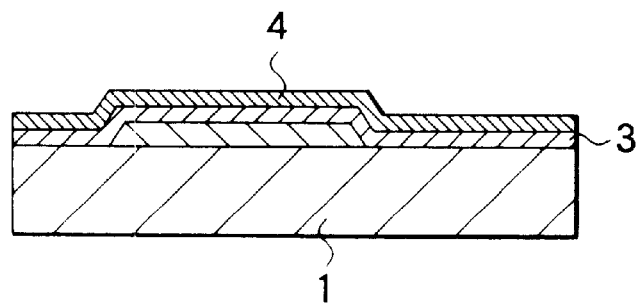
FIG. 5B is a sectional view showing the TFT of FIG. 4 according to a prossesing scheme.

Then, the glass insulating substrate 1 having the gate electrode 2 formed thereon is heated to 623K and the material gas for the formation of the gate insulating film which is composed of $SiH_4$, $NH_3$, and $N_2$ is introduced to give rise to a plasma state and deposit the gate insulating film 3 of $SiN_x$ with a thickness of 0.3 µm as shown in FIG. 5B. The plasma state existent daring the deposition of the gate insulating film is subsequently retained without interruption and the gas being introduced is switched from the material gas for the deposition of the gate insulating film to the $H_2$ gas. The $SiH_4$ gas is introduced in conjunction with the $H_2$ gas to form an a-Si film 4 of a thickness of 0.05 µm as a semiconductor film.

Figure 5C:
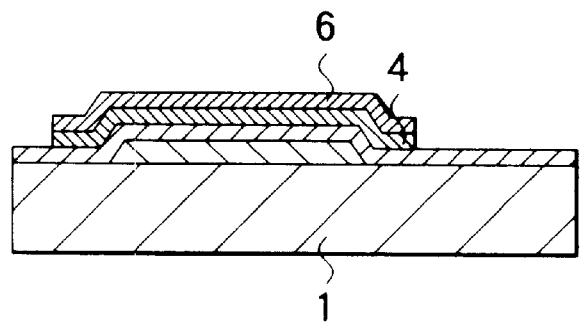
FIG. 5C is a sectional view showing the TFT of FIG. 4 according to a prossesing scheme.

The glass insulating substrate 1 having the a-Si film 4 and the like formed thereon is heated and the material gas for the deposition of the n type semiconductor film which is composed of $PH_3$ and $SiH_4$ is introduced to give rise to a plasma state as will be specifically mentioned hereinbelow and deposit a $n^+$ a-Si film of a thickness of 0.05 µm in such a manner as to cover the a-Si film 4. Then, by the photolithographic method, this $n^+$ a-Si film is etched to form the n type semiconductor film 6 of the predetermined shape and the underlying a-Si film is etched to produce the semiconductor film 4 of the predetermined shape as shown in FIG. 5C.

Figure 5D:
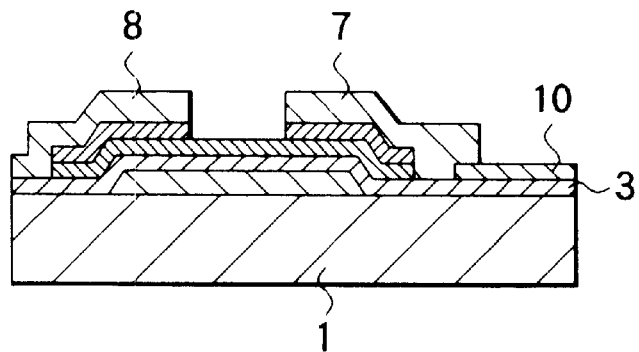
FIG. 5D is a sectional view showing the TFT of FIG. 4 according to a prosseseing scheme.

Thereafter, a transparent electrical conductive film of ITO is formed by the sputtering technique on the glass insulating substrate 1 having the n type semiconductor film 6 formed thereon and is then etched by the photolithographic method to form a pixel electrode 10 of a transparent electrical conductive film in a predetermined shape at a stated position on the gate insulating film 3 as shown in FIG. 5D.

Further, on the glass insulating substrate 1 having the pixel electrode 10 formed thereon, a metal film of Cr or Al is formed by the sputtering technique. Then, by the photolithographic method, the source electrode 7 connecting the n type semiconductor film 6 and the pixel electrode 10 and the drain electrode 8 connected to the n type semiconductor film 6 are formed integrally with the column lines. The part of the n type semiconductor film 6 in the channel region is removed by photolithographic etching as masked by the source electrode 7 and the drain electrode 8. Then, the TFT is completed by forming an insulating protective film of $SiN_x$ by the plasma CVD technique on the glass insulating substrate 1 having the source electrode 7 and the drain electrode 8 formed thereon (FIG. 4).

For the formation of the $SiN_x$ film intended for the gate insulating film and the a-Si film intended for the semiconductor film in this TFT, the glass insulating substrate 1 having the gate electrode formed thereon is fixed on the grounding electrode 14 in the reaction chamber 12 of the device shown in FIG. 3 and the reaction chamber 12 is evacuated. The glass insulating substrate 1, when necessary, may be fixed on the high-frequency electrode 13 instead. Then, the glass insulating substrate 1 is heated to 623K by means of the resistance heating unit 18 disposed on the grounding electrode 14 and, as the material gas for the deposition of the gate insulating film, $SiH_4$ gas fed at a flow volume of 10 sccm, $NH_3$ gas at 60 sccm, and $N_2$ gas at 400 sccm are introduced into the reaction chamber 12 to adjust the pressure in the reaction chamber 12 to 0.8 Torr. With the distance between the high-frequency electrode 13 and the grounding electrode 14 adjusted at 30 mm, an electric power of 50 W is supplied from the high-frequency power source 19 to generate a plasma state between the electrodes and form the gate insulating film of $SiN_x$ with a thickness of 0.3 μm.

The introduction of the material gas for the deposition of the gate insulating film is stopped and, at the same time, the introduction of the $H_2$ gas is started at a flow volume of 500 sccm to adjust the pressure of the gaseous atmosphere in the reaction chamber 12 at 0.3 Torr. With the distance between the electrodes set at 35 mm and the electric power from the high-frequency power source 19 set at 35 W, the plasma state existent during the deposition of the gate insulating film is continuously retained without interruption on the electrode 14. The effect of the residual gas during the deposition of the gate insulating film can be eliminated by introducing the $H_2$ gas in such a large amount as mentioned above and setting the pressure in the reaction chamber 12 at 0.3 Torr. The chemical effect by the $H_2$ plasma on the gate insulating film can be avoided and the plasma state can be stably retained by setting the distance between the electrodes at a large magnitude of 35 mm. For the sake of avoiding the chemical effect inflicted by the $H_2$ plasma on the gate insulating film, the duration of the plasma state is desired to be in the range of from 3 to 20 seconds.

Further, by the $H_2$ plasma, the interface between the gate insulating film mentioned above and the a-Si film to be formed subsequently thereon can be kept clean.

Then, by introducing the $H_2$ gas at a flow volume of 500 sccm thereby adjusting the pressure in the reaction chamber 12 at 2 Torr and, at the same time, setting the distance between the electrodes at 28 mm and the electric power from the high-frequency power source 19 at 50 W. the plasma state is stably retained. Owing to the stability of the state of plasma, the interface between the gate insulating film and the a-Si film subsequently formed thereon can be desirably formed and the dangling bond can be abated.

Further, the $SiH_4$ gas is introduced at a flow volume of 30 sccm and the distance between the electrodes is changed to 26 mm to deposit the a-Si film with a thickness of 0.05 μm.

Incidentally, when the distance between the high-frequency electrode 13 and the grounding electrode 14 is continuously adjusted in the stepwise pattern as described above, the plasma state can be stably retained without interruption in conformity with the kind of gas introduced, the internal pressure of the reaction chamber, and the high-frequency electric power supplied in the same way as in Example 1. As a result, the dangling bond near the interface between the gate insulating film 3 and the semiconductor film 4 and the interface between the semiconductor film 4 and the etching-stopper film on channel 5 can be obviously alleviated.

To be specific, the $SiN_x$ film which constitutes itself the gate insulating film 3 and the a-Si film 4 of the semiconductor film 4 can be deposited under the optimized condition and the dangling bond near the interface between the gate insulating film 3 and the semiconductor film 4 can be abated by effecting continuous stepwise adjustment of the distance between the high-frequency electrode 13 and the grounding electrode 14 and consequently regulating the process conditions so as to increase the distance between the electrodes when the pressure in the reaction chamber is high and decrease the distance when the pressure is low in conformity with the kind of gas introduced and the pressure it the reaction chamber. When a liquid crystal display substrate containing the TFT manufactured by the method of this invention is incorporated by the standard process in an active matrix type liquid crystal display device and this device is operated, the TFT manifests an outstanding switching property.

EXAMPLE 3

Figure 6:
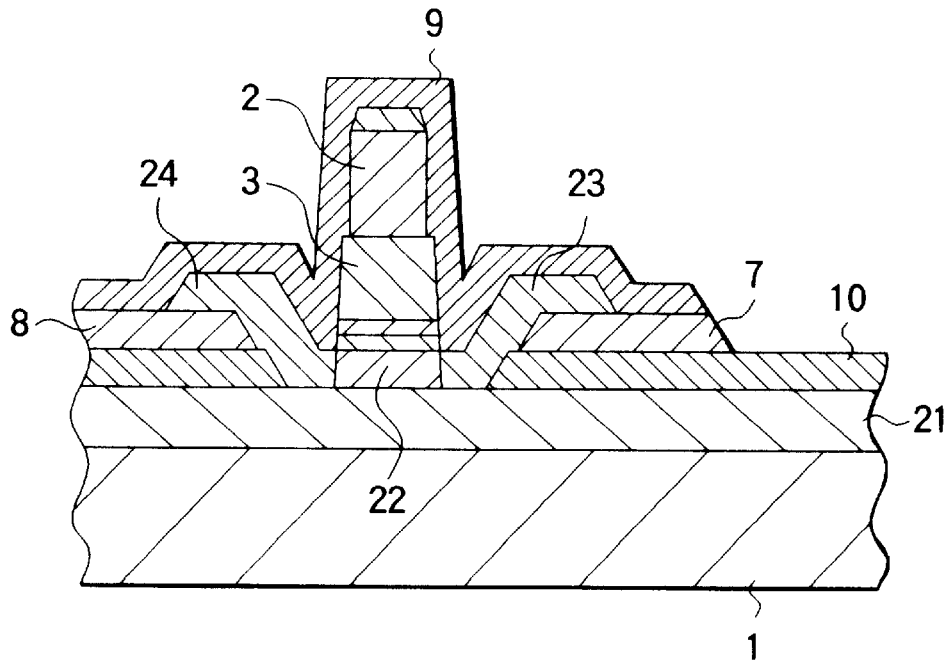
FIG. 6 is a sectional view showing a construction of a normal staggered TFT in the example 3.

FIG. 6 shows a normal staggered (top-gate) TFT according to Example 3. In this TFT, an insulating substrate 1 made of glass (such as, for example, a product of Corning Glass marketed under product code of "7059") is heated to 623K and a gas composed of $SiH_4$ and nitrogen suboxide ($N_2O$) is introduced and, by the plasma CVD technique using the plasma state which is consequently generated, an undercoat film 21 of $SiO_2$ is deposited in a thickness of 0.5 μm.

Then, an ITO film of a thickness of 0.1 μm for the formation of a pixel electrode 10 is formed and a metal of Mo-W is deposited in the form of a film by the sputtering technique. These films are photolithographically etched to form a source electrode 7 and a drain electrode 8 in predetermined shapes.

Then, the insulating substrate 1 is heated to 623K and the material gas for the deposition of a semiconductor layer which is composed of $SiH_4$ and $H_2$ is introduced to generate a plasma state and deposit an a-Si film 22 of a thickness of 0.1 μm. After the deposition of this film, the plasma state existent during the deposition of the a-Si film 22 is retained, the introduction of the $SiH_4$ gas is stopped, the gas being introduced is switched from the material gas for the deposition of the a-Si film to the $H_2$ or the He gas, and the $SiH_4$ gas is again introduced to deposit a gate insulating film 3 of $SiN_x$ in a thickness of 0.02 μm. subsequently, the introduction of the $SiH_4$ gas is stopped and the plasma state with the $N_2$ gas is continuously retained and the $SiH_4$ and the $N_2O$ gas are introduced to form an SiO film in a thickness of 0.02 μm. Then, the introduction of the $SiH_4$ and the $N_2O$ gas is stopped and, with the plasma state with the $N_2$ gas continued, the $SiH_4$ and the $NH_3$ gas are introduced to form a $SiN_x$ film in a thickness of 0.4 μm.

Subsequently, a metal film consisting of an aluminum (Al) film 0.3 μm in thickness and a Mo film 0.2 μm in thickness is formed on the insulating substrate 1 by the sputtering technique. This metal film and the gate insulating film 3 are subjected to chemical dry etching effected by the photolithographic technique to form the gate electrode 2 in a predetermined shape in conjunction with the gate line and expose the part of the a-Si/$SiN_x$/SiO structure from the part devoid of the gate electrode 2. At this time, a fluorine type gas is used to etch exclusively the $SiN_x$ film in the upper layer and expose the SiO film. When the a-Si/$SiN_x$/SiO structure is left intact as described above, the laser anneal can be easily effected.

Further, the a-Si film is doped with P ions with the gate a electrode 2 improvised as a mask. This ion doping is implemented by decomposing by a plasma the $PH_3$ gas diluted to 5% with $H_2$, causing the consequently generated ion species to be collectively accelerated by an electric field without mass separation, and driving the accelerated ion species into the a-Si film. In this case, the amount of the ion species used for the doping is $3 \times 10^{15}$ cm$^{-2}$ and the accelerating voltage is 60 kV.

Then, the insulating substrate 1 is irradiated with an XeCl excimer laser of a wavelength of 308 nm and an energy density of 70 mJ which is projected from above. As concrete examples of the laser which is usable for this purpose, the excimer lasers of ArF, KrF, and XeF and the YAG laser, and the Ar laser may be cited. In this case, the gate electrode 2 serves as a mask and the part of the a-Si film which has been doped with P ions is exclusively crystallized. Thus, an n type polycrystalline silicon of low resistance is formed. By photolithographically etching this n type polycrystalline silicon film, a source region 23 and a drain region 24 are formed.

Thereafter, an insulating protective film 9 of SiN$_x$ is formed by the plasma CVD technique on the insulating substrate 1 and is photolithographically etched to remove the part of the insulating protective film on the pixel electrode 10. Further, the part of the metal film of Mo-W on the picture element electrode 10 is removed.

When a liquid crystal display substrate containing the TFT manufactured as described above is incorporated by the standard process in an active matrix type liquid crystal display device and this device is operated, the liquid crystal display device manifests an outstanding switching property.

EXAMPLE 4

Figure 7:
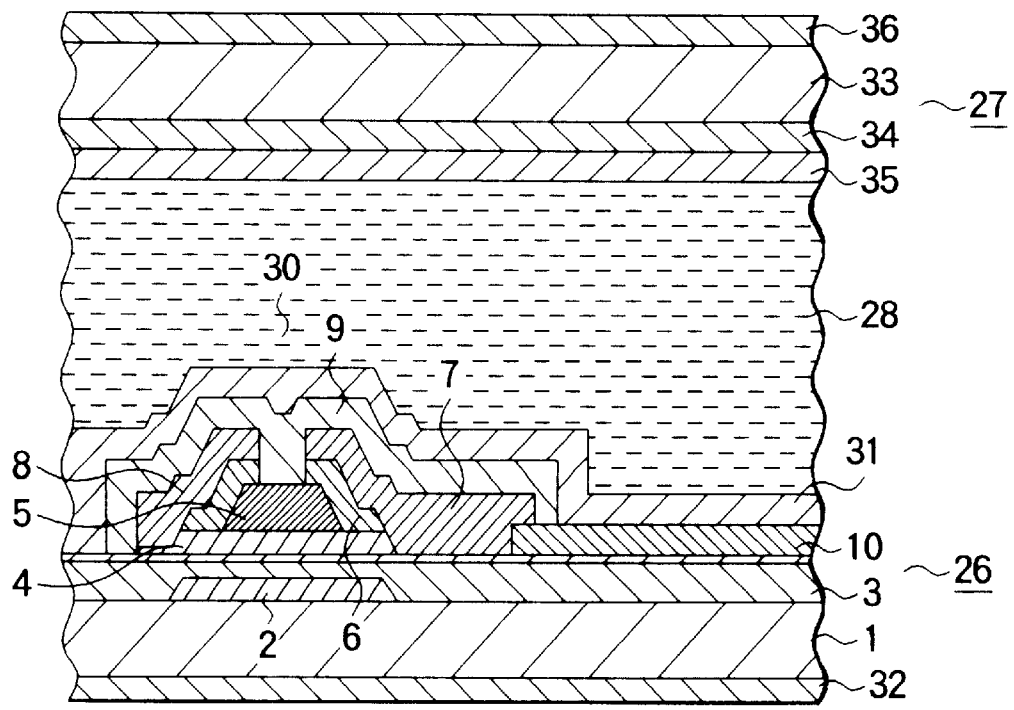
FIG. 7 is a sectional view showing the construction of a liquid crystal display device in the example 4.

The construction of a liquid crystal display device (LCD) using the aforementioned TFT as a switching element is shown in FIG. 7. This liquid crystal display device is composed of an active element substrate 26, a counter substrate 27 opposed to the active element substrate 26 across a predetermined interval, and a liquid crystal 28 filling the gap between these substrates 26 and 27.

On the main surface of this active element substrate 26 which confronts the counter substrate 27 of the transparent insulating substrate 1 made of glass, a TFT 30 which is composed of a gate electrode 2, a gate insulating film 3, a semiconductor film 4, a etching stopper film on channel 5, an n type semiconductor film 6, a source electrode 7, a drain electrode 8, and an insulating protective film 9 as shown in FIG. 1 and a pixel electrode 10 are formed. Further, an aligning film 31 made of a cold curing type polyimide resin, for example, is provided on the TFT 30 and the pixel electrode 10. A polarizer 32 is formed to cover the outer main surface (the main surface on the opposite side) of the transparent insulating substrate 1. On the main surface of the counter substrate 27 which confronts the active element substrate 26 of a transparent insulating substrate 33 made of glass, a common electrode 34 made of ITO is formed. On this common electrode 34, like the active element substrate 26, an aligning film 35 made of a cold curing type polyimide resin is provided. The main surface (on the opposite side) of the counter substrate 27 outside the transparent insulating substrate 33 is covered with a polarizer 36. The aligning films 31 and 35 of the substrates 26 and 27 are rubbed severally with cloth in predetermined directions to acquire axes of orientation which intersect each other at an angle of about 90°.

The directions in which the aligning films 31 and 35 of the substrates 26 and 27 are rubbed are so set that the respective optimum viewing direction toward the front side. This liquid crystal display element is illuminated from the outside of the main surface of either of the active element substrate 26 and the counter substrate 27.

Owing to the construction described above, the liquid crystal display device excels in TFT property, stability, and insulating property and enjoys a high yield of production.

EXAMPLE 5

The method for the formation of a multilayer film which constitutes itself a thin-film transistor will be described in greater detail below. The TFT is constructed in the same inverted staggered (bottom gate) type as shown in FIG. 1.

Figure 8:
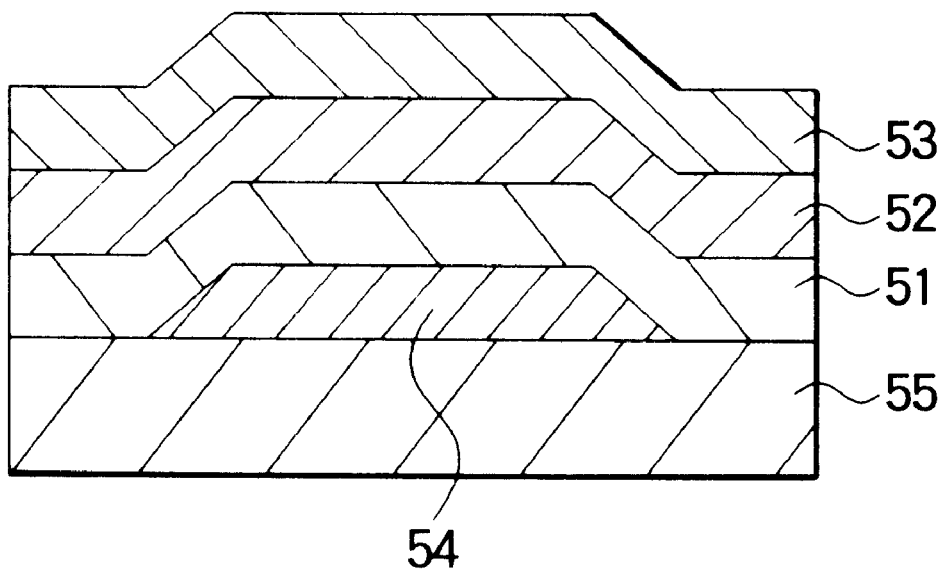
FIG. 8 is a sectional view showing a multilayer film in the example 5.

FIG. 8 shows a gate insulating film 51, a semiconductor film 52, and a etching-stopper-film on channel 53 which jointly constitute the TFT. The gate insulating film 51 is formed of SiN$_x$ in a thickness of 0.05 μm, the semiconductor film 52 formed of a-Si in a thickness of 0.05 μm, and the etching-stopper-film 53 formed of SiN$_x$ in a thickness of 0.3 μm.

The device used for the manufacture has the same construction as is shown in FIG. 3.

In this example, the part of the TFT which continuously forms the SiN$_x$ gate insulating film 52, a-Si semiconductor film 52, and SiN$_x$ etching-stopper-film on channel 53 will be described. The process used for the manufacture is shown in FIG. 9.

A glass insulating substrate 55 having a gate electrode 54 formed by a predetermined method thereon is fixed on a grounding electrode 14 inside a reaction chamber 12 and the reaction chamber 12 is evacuated.

Step 1: The material gas composed of SiH$_4$, NH$_3$, and N$_2$ is introduced into the reaction chamber 12 to generate a plasma state and deposit the SiN$_x$ insulating film 51. The temperature of the substrate is 573 K.

Step 2: After the deposition of the SiN$_x$ gate insulating film 51, the introduction of the material gas is stopped and the introduction of H$_2$ gas as a preparatory gas is started at the same time. The plasma state is continuously retained by adjusting the distance between the electrodes wider. Though the interior of the reaction chamber is in an evacuated state, the partial pressure of the H$_2$ gas which is flowing is present in the reaction chamber and allows to retain the plasma state.

Step 3: With the introduction of the H$_2$ gas as the preparatory gas continued, the internal pressure of the reaction chamber 12 is adjusted to 1.2 Torr. The plasma state continues. The interface can be advantageously formed by adjusting the pressure at a level lower than the pressure, 3 Torr, which will exist during the subsequent deposition of the a-Si semiconductor film 52. Otherwise, the high-frequency electric power may be adjusted in the range of from 150 to 200 W, with the pressure kept intact.

Step 4: The SiH$_4$ gas is added to form a material gas and the internal pressure of the reaction chamber is adjusted to 3 Torr to form the a-Si semiconductor film 52.

Step 5: The introduction of SiH$_4$ is stopped and the introduction of H$_2$ gas as the preparatory gas is started simultaneously. The plasma state is continuously retained by adjusting the distance between the electrodes wider. Though the interior of the reaction chamber 12 is in an evacuated state, the partial pressure of the H$_2$ gas which is still flowing is present in the reaction chamber 12 and allows to retain the plasma state continuously.

Step 6: The introduction of NH$_3$ gas add to the H$_2$ gas as the preparatory gas is started to adjust the internal pressure of the reaction chamber 12 to 3.5 Torr.

Step 7: The introduction of the H$_2$ gas is stopped and the introduction of N$_2$ gas as the preparatory gas is started simultaneously to adjust the internal pressure of the reaction chamber at 3.5 Torr. The interface can be advantageously formed by adjusting the pressure to a level equaling the pressure, 3.5 Torr, which will exist during the subsequent deposition of the $SiN_x$ etching-stopper-film on channel 53.

Step 8: The $SiH_4$ gas is added to form the material gas to deposit the $SiN_x$ etching-stopper-film on channel 53.

The plasma state continues to be generated throughout the entire process for the formation of the multilayer film as clearly remarked from the description given above. The multilayer film to be produced is enabled to acquire a highly desirable interface by effecting stepwise adjustment of such conditions as the kind of gas introduced, the internal pressure of the reaction chamber, the distance between the electrodes, and the high-frequency electric power supplied thereby optimizing the state of plasma.

The durations of the steps of film forming at Steps 2, 3, 5, 6, and 7 are desired to be in the range of from 3 to 20 seconds for the purpose of preventing the surfaces under treatment from being degraded by the chemical action of the $H_2$ plasma particularly when the $H_2$ gas is introduced as the preparatory gas.

The process described above is just one example. The plasma state can be retained and the multilayer film produced in high quality by varying the conditions in conformity with the speed of film depositing desired, the duration of film depositing, the temperature of the substrate, or the like.

Figure 10:
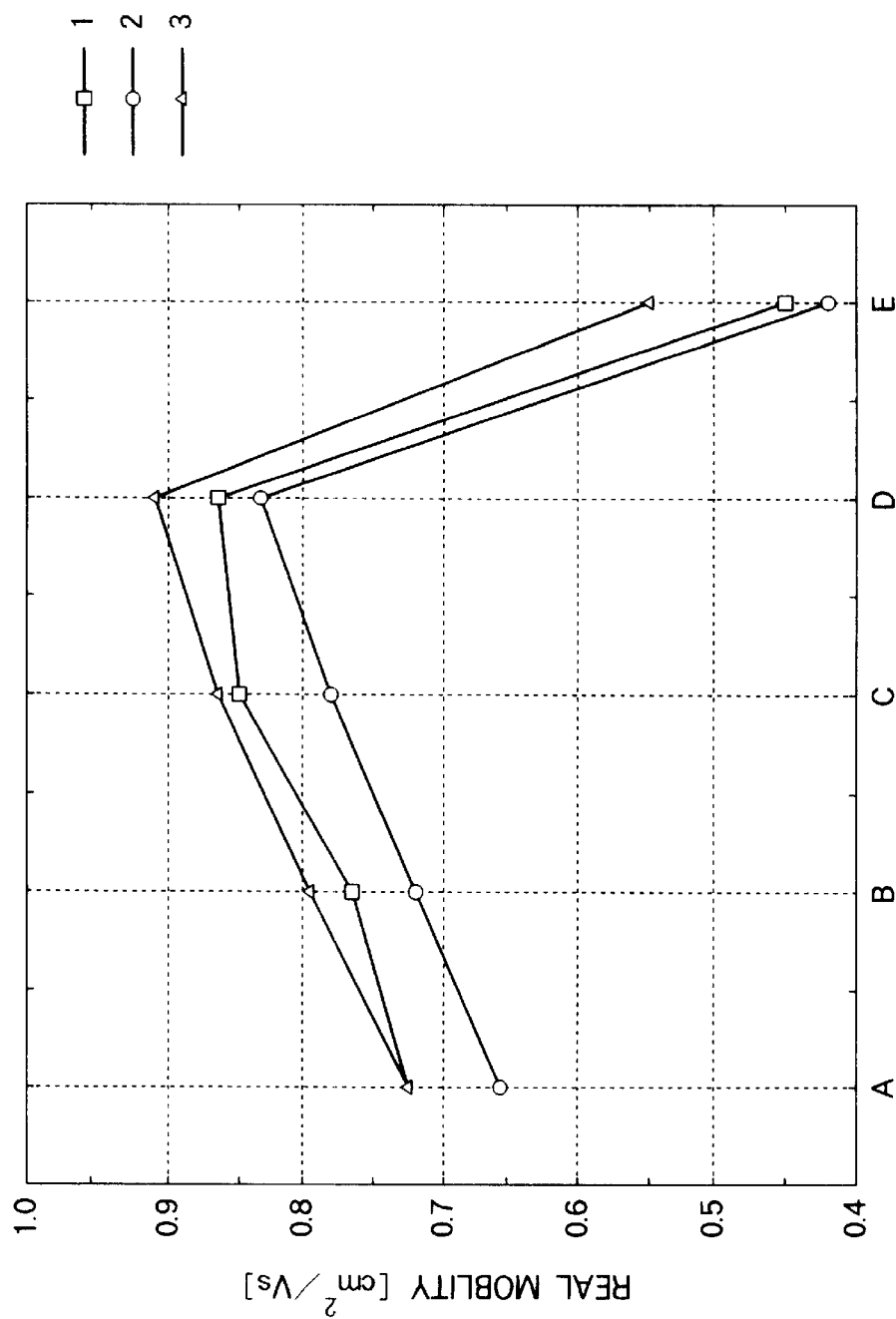
FIG. 10 shows the mobility of the TFT formed by the method of this invention.

FIG. 10 shows the mobility of a thin-film transistor which is formed by the method described above. The symbols A through D represent conditions of multilayer films intended for thin-film transistors according to the present invention. The symbol E represents a condition of the conventional method which stops the plasma state after each step. In each condition, 3 samples 1–3 are shown. The symbol A represents sample obtained with Step 3 performed under the conditions of 3 Torr and 100 W. The symbol B represents samples obtained with Step 3 performed under the conditions of 3 Torr and 150 W. The symbol C represents samples obtained with Step 3 performed under the conditions of 3 Torr and 200 W. The symbol D represents samples obtained with Step 3 performed under the conditions of 1.2 Torr and 100 W. The symbol E represents samples obtained by the conventional method which stops the plasma state after each step.

It is clearly noted from the data of FIG. 10 that the thin-film transistors obtained by continuously retaining the plasma state are excel in the mobility. This is because the interfaces corresponding to the channel the thin-film transistors are desirably formed.

For the adjusted magnitude of the pressure at Step 3, the desirability of the interface and the mobility of the thin-film transistor are exalted in proportion as the high-frequency electric power supplied is increased. The desirability of the interface and the mobility of the thin-film transistor are further exalted by adjusting the pressure existent at Step 3 to a level lower than the pressure which will exist during the subsequent deposition of the a-Si semiconductor film.

Figure 11:
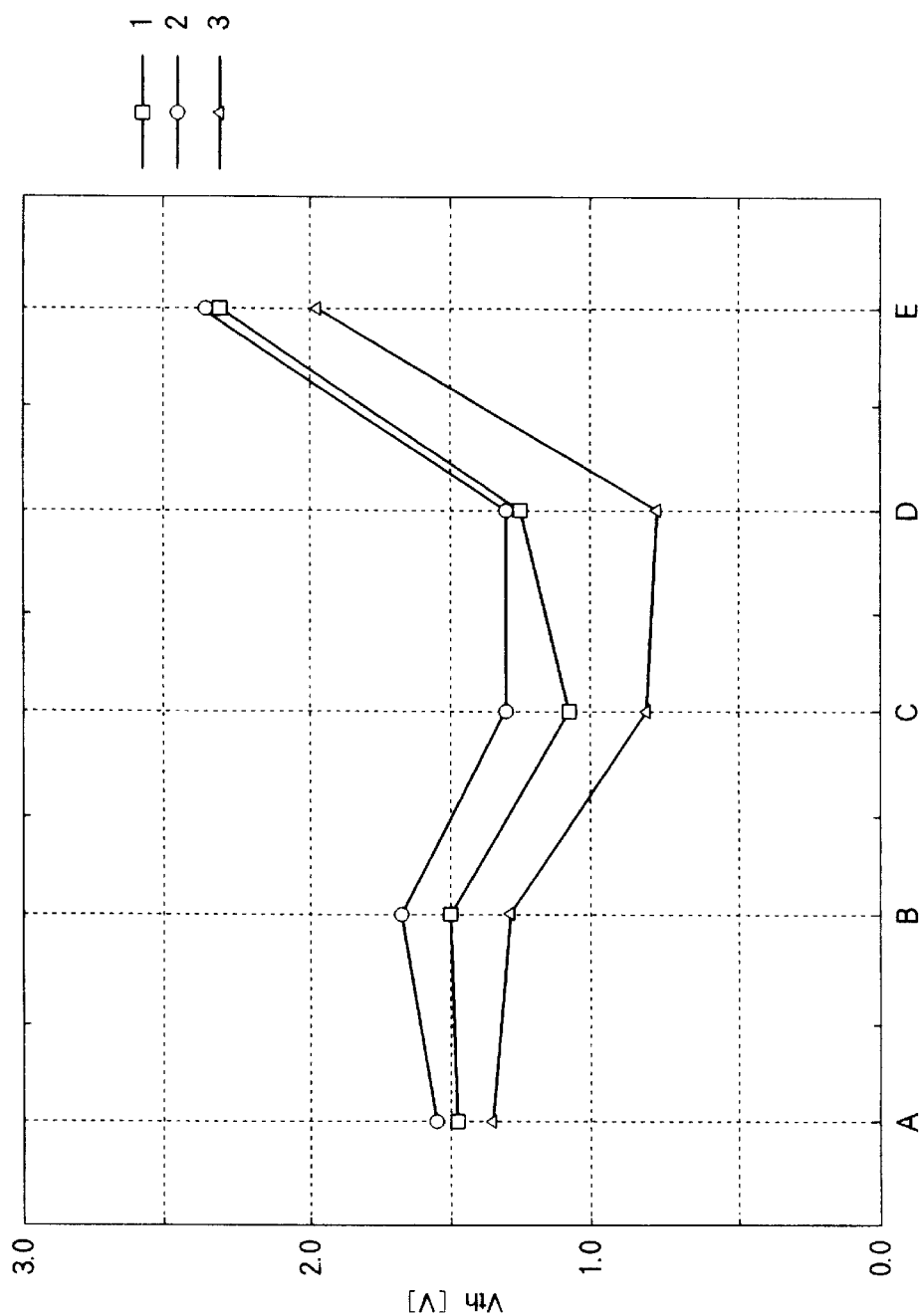
FIG. 11 shows the threshold voltage of the TFT formed by the method of this invention.

FIG. 11 shows the threshold voltage, Vth, of a thin-film transistor formed by the method described above. The symbols A through D represent conditions of multilayer films obtained by this invention for the construction of thin-film transistors. The symbol E represents a condition of the conventional method which stops the plasma state after each step. In each condition, 3 samples are shown.

The symbol A represents samples obtained with step 3 performed under the conditions of 3 Torr and 100 W. The symbol B represents samples obtained with Step 3 performed under the conditions of 3 Torr and 150 W. The symbol C represents samples obtained with Step 3 performed under the conditions of 3 Torr and 200 W. The symbol D represents samples obtained with Step 3 performed under the conditions of 1.2 Torr and 100 W. The symbol E represents samples obtained by the conventional method which stops the state of plasma after each step.

It is clearly noted from the data of FIG. 11 that the thin-film transistors produced by continuously retaining the plasma state are excel in the threshold voltage. This is because the interfaces corresponding to the channel parts of the thin-film transistors are desirably formed.

For the adjusted magnitude of the pressure at Step 3, the desirability of the interface is increased and the magnitude of the threshold voltage of the thin-film transistor is decreased in proportion as the high-frequency electric power supplied is increased. The desirability of the interface is further increased and the mobility of the thin-film transistor is further decreased by adjusting the pressure existent at Step 3 to a level lower than the pressure which will exist during the subsequent deposition of the a-Si semiconductor film.

When a liquid crystal display device is manufactured by using as a switching element therefor a thin-film transistor obtained by the method of this invention for the formation of a multilayer film, it enjoys highly satisfactory qualities such as high response speed and small power consumption.

This invention can be utilized for the formation of multilayer films intended for the construction of other semiconductor devices. The multilayer films may be used for contact sensors, solar cells, etc.

EXAMPLE 6

The method for the formation of a multilayer film for the construction of a thin-film transistor will be described more specifically below.

Figure 12:
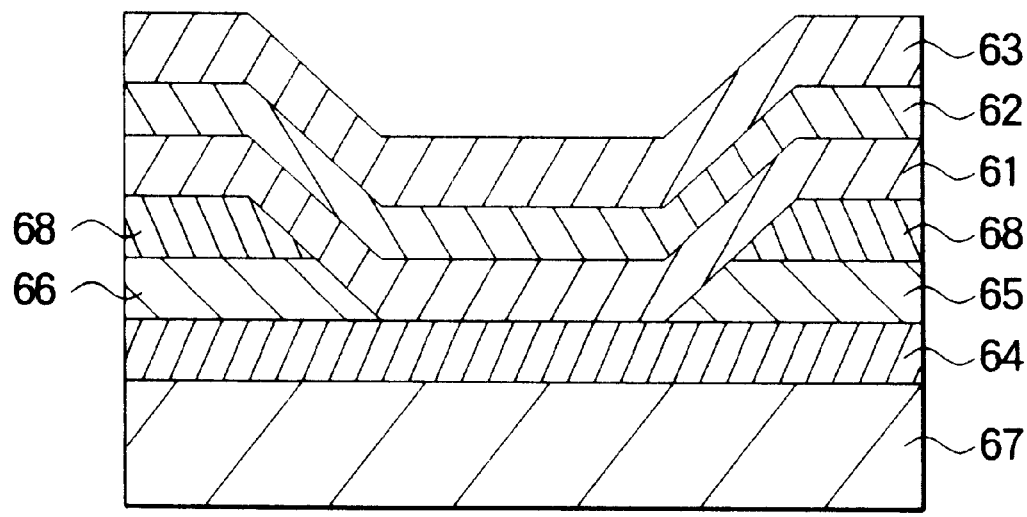
FIG. 12 is a sectional view showing a multilayer film in the example 6.

The construction of the TFT is of the same normal staggered (top-gate) type as is shown in FIG. 6. FIG. 12 is a diagram showing with a model the part of the TFT forming a semiconductor film and gate insulating films. A semiconductor film 61 is formed of a-Si in a thickness of 0.1 μm. A gate insulator film 62 is composed of the three layers, $SiN_x$ film, SiO film, and $SiN_x$ film (not shown). Specifically, the gate insulating film 62 is formed of SiNe in a thickness of 0.02 μm, the gate insulating film 63 formed of SiO in a thickness of 0.02 μm, and the gate insulating film formed of $SiN_x$ (not shown) in a thickness of 0.4 μm.

The device used for the manufacture is in the same construction as is shown in FIG. 3.

In this example, the part of the TFT in which the a-Si semiconductor film 61, the $SiN_x$ gate insulating film 62, and the Sio gate insulating film 63 are continuously deposited will be described. The process used for the manufacture is shown in FIG. 13.

A glass insulating substrate 67 having a $SiO_2$ undercoat film 64, a source electrode 65, and a drain electrode 66 formed by the predetermined method thereon is fixed on the grounding electrode 14 in the reaction chamber 12 and the reaction chamber 12 is evacuated.

Step 1: The material gas composed of $SiH_4$ and $N_2$ is introduced into the reaction chamber 12 to generate a plasma state and deposit the a-Si film. The temperature of the substrate is 593 K.

Step 2: After the deposition of the a-Si semiconductor film 61, the introduction of $SiH_4$ is stopped and the introduction of H₂ gas a preparatory gas is started at the same time. The plasma state is continuously retained by increasing the distance between the electrodes. Though the interior of the reaction chamber is in an evacuated state, the partial pressure of the H₂ gas which is flowing is present in the reaction chamber and allows to retain the plasma state.

Step 3: The introduction of H₂ gas is stopped and the introduction of NH₃ gas and N₂ gas are started simultaneously. The internal pressure of the reaction chamber 12 is adjusted to 0.5 Torr. The interface can be advantageously formed by adjusting the existent pressure at a level lower than the pressure, 0.8 Torr, which will exist during the subsequent deposition of the SiN$_x$ gate insulating film 62.

Step 4: The SiH₄ gas is added over the NH₃ gas and N₂ gas to form a material to deposit the SiN$_x$ gate insulating film 62.

Step 5: The introduction of SiH₄ and NH₃ is stopped and the introduction of N₂ gas as the preparatory gas is started. The plasma state is continuously retained by increasing the distance between the electrodes. Though the interior of the reaction chamber 12 is in an evacuated state, the partial pressure of the N₂ gas which is still flowing is present in the reaction chamber 12 and allows to retain the plasma state.

Step 6: The N₂O gas is introduced as the preparatory gas to adjust the internal pressure of the reaction chamber 12 to 0.8 Torr. The interface can be advantageously formed by adjusting the existent pressure at a level lower than the pressure, 1.2 Torr, which will exist during the subsequent deposition of the SiO gate insulating film 63.

Step 7: The SiH₄ gas is added over the N₂ gas and N₂O gas to form the material gas to deposit the SiO gate insulating film 63.

The interface can be advantageously formed by effecting the multistage adjustment of such conditions as the kind of gas introduced, the internal pressure of the reaction chamber, thee distance between the electrodes, and the high-frequency electric power supplied thereby optimizing and retaining the plasma state.

The durations of the steps of film forming at Steps 2, 3, 5 and 6 desired to be in the range of from 3 to 20 seconds for the purpose of preventing the surfaces under treatment from being degraded by the chemical action of the H₂ plasma particularly when the H₂ gas is introduced as the preparatory gas.

The process described above is just one example. The plasma state can be retained and the multilayer film produced in high quality by varying the conditions in conformity with the speed of film depositing desired, the temperature of the substrate, or the like.

When a liquid crystal display device is manufactured by using as a switching element therefor a thin-film transistor obtained by the method of this invention for the formation of a multilayer film, it enjoys highly satisfactory qualities such as high response speed and small power consumption.

This invention can be utilized for the formation of multilayer films intended for the construction of other semiconductor devices. The multilayer films may be used for contact sensors, solar cells, etc.

What is claimed is:

1. A method for forming a multilayer film having at least a first film and a second film formed on the first film, comprising steps of:

(a) introducing a first Si-containing gas and a first Si-free gas into a reduced-pressure reaction chamber provided with at least a pair of planar electrodes, generating a plasma state therein and depositing the first film on a substrate or a substrate having a film already formed thereon;

(b) terminating at least the first Si-containing gas and stopping the deposition the first film; and (c) introducing a second Si-containing gas and a second Si-free gas into the reduced-pressure reaction chamber and depositing the second film on the first film;

wherein, during an interval after terminating the first Si containing gas until the second Si containing gas is introduced, at least one preparatory gas for retaining the plasma state which is not capable of depositing the first film or the second film is introduced into the chamber, wherein the plasma state during the interval is controlled during a first stage and a second stage which is consecutive to the first stage, and wherein $P_1 < P_2 \leq P_c$ and $P_1 < P_a$, where $P_1$ is a pressure in the chamber within the first stage, $P_2$ is a pressure in the chamber during the second stage, $P_a$ is a pressure in the chamber within step (a), and $P_c$ is a pressure in the chamber within step (c).

2. The method for forming a multilayer film as set forth in claim 1, wherein $D_1 > D_2 \geq D_c$ and $D_1 > D_a$, where $D_1$ is a distance between the electrodes during the first stage, $D_2$ is a distance between the electrodes during the second stage, $D_a$ is a distance between the electrodes during the step (a), and $D_c$ is a distance between the electrodes during the step (c).

3. The method for forming a multilayer film as set forth in claim 1, wherein the preparatory gas consists of at least one gas selected from the first Si-free gas or the second Si-free gas.

4. The method for forming a multilayer film forth in claim 1, wherein the preparatory gas consists of at least one gas selected from H₂, He, Ar, N₂, NH₃, N₂O, or Kr.

5. The method for forming a multilayer film as set forth in claim 1, wherein the first film consists essentially of one component selected from SiN$_x$, SiO$_x$, or SiON, and the second film consists essentially of one component selected from a-Si, poly-Si, or μc-Si.

6. The method for forming a multilayer film as set forth in claim 1, wherein the first film consists essentially of one component selected from a-Si, poly-Si, or μc-Si, and the second film consists essentially of one component selected from SiN$_x$, SiO$_x$, or SiON.

7. The method for forming a multilayer film asset forth in claim 1, wherein the first film is a gate insulating film and the second film is a semiconductor film.

8. The method for forming a multilayer film as set forth in claim 1, wherein the first film is a semiconductor film and the second film is a gate insulating film.

9. A method for forming a multilayer film having at least a first film and a second film formed on the first film, comprising steps of:

(a) introducing a first Si-containing gas and a first Si-free gas into a reduced-pressure reaction chamber provided with at least a pair of planer electrodes, generating a plasma state therein and depositing the first film on a substrate or a substrate having a film already formed thereon;

(b) terminating at least the first Si-containing gas and stopping deposition of the first film; and (c) introducing a second Si-containing gas and a second Si-free gas into the reduced-pressure reaction chamber and depositing the second film on the first film;

wherein, during an interval after terminating the first Si-containing gas until the second Si-containing gas is introduced, at least one preparatory gas for retaining the plasma state which is not capable of depositing the first film or the second film is introduced into the chamber, wherein the plasma state during the interval is controlled in a first stage and a second stage which is consecutive to the first stage, and wherein $D_1 > D_2 \geq D_c$ and $D_1 > D_a$, where $D_1$ is a distance between the electrodes within the first stage, $D_2$ is a distance between the electrodes within the second stage, $D_a$ is a distance between the electrodes within the step (a), and $D_c$ is a distance between the electrodes within the step (c).

10. The method for forming a multilayer film as set forth in claim 9, wherein the preparatory gas consists of at least one gas selected from the first Si-free gas or the second Si-free gas.

11. The method for forming a multilayer film as set forth in claim 9, wherein the preparatory gas consists of at least one gas selected from $H_2$, He, Ar, $N_2$, $NH_3$, $N_2O$, or Kr.

12. The method for forming a multilayer film as set forth in claim 9, wherein the first film consists essentially of one component selected from $SiN_x$, $SiO_x$, or SiON, and the second film consists essentially of one component selected from a-Si, poly-Si, or $\mu$ c-Si.

13. The method for forming a multilayer film as set forth in claim 9, wherein the first film consists essentially of one component selected from a-Si, poly-Si, or $\mu$ c-Si, and the second film consists essentially of one component selected from $SiN_x$, $SiO_x$, or SiON.

14. The method for forming a multilayer film as set forth in claim 9, wherein the first film is a gate insulating film and the second film is a semiconductor film.

15. The method for forming a multilayer film as set forth in claim 9, wherein the first film is a semiconductor film and the second film is a gate insulating film.

* * * * *

UNITED STATES PATENT AND TRADEMARK OFFICE
CERTIFICATE OF CORRECTION

PATENT NO.: 6,037,017

DATED: March 14, 2000

INVENTOR(S): Kashiro

It is certified that an error appears in the above-identified patent and that said Letters Patent is hereby corrected as shown below:

Title page, item [57] (Abstract), line 19, change "cause" to --causes--; and
                line 20, change "films constitutes" to --film constituting a--.

Claim 4, column 20, line 38, before "forth" insert --as set--.

Signed and Sealed this

Twenty-seventh Day of March, 2001

Attest:

NICHOLAS P. GODICI

Attesting Officer      *Acting Director of the United States Patent and Trademark Office*